United States Patent
Kiryu

(10) Patent No.: US 7,308,634 B2
(45) Date of Patent: Dec. 11, 2007

(54) SYSTEMS AND METHODS FOR LBIST TESTING USING MULTIPLE FUNCTIONAL SUBPHASES

(75) Inventor: Naoki Kiryu, Austin, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 215 days.

(21) Appl. No.: 11/096,787

(22) Filed: Apr. 1, 2005

(65) Prior Publication Data

US 2006/0236181 A1    Oct. 19, 2006

(51) Int. Cl.
*G01R 31/28* (2006.01)
(52) U.S. Cl. .................... 714/733; 714/726; 714/738
(58) Field of Classification Search .................. 714/30, 714/727, 726, 732, 734, 733, 738; 365/201
See application file for complete search history.

(56) References Cited

U.S. PATENT DOCUMENTS

| | | | |
|---|---|---|---|
| 5,617,531 A * | 4/1997 | Crouch et al. ................ 714/30 |
| 5,946,246 A * | 8/1999 | Jun et al. .................... 365/201 |
| 5,983,380 A | 11/1999 | Motika et al. |
| 6,408,413 B1 * | 6/2002 | Whetsel ....................... 714/727 |
| 6,567,325 B1 * | 5/2003 | Hergott ....................... 365/201 |
| 6,671,838 B1 * | 12/2003 | Koprowski et al. ......... 714/726 |
| 6,807,645 B2 * | 10/2004 | Angelotti et al. ........... 714/732 |

* cited by examiner

*Primary Examiner*—David Ton
(74) *Attorney, Agent, or Firm*—Law Offices of Mark L. Berrier

(57) ABSTRACT

Systems and methods for performing logic built-in-self-tests (LBISTs) in digital circuits, where the LBIST circuitry is configured to propagate data through different portions of the functional logic of the circuits at different times. In one embodiment, a logic circuit incorporates LBIST components including a set of scan chains interposed between portions of the functional logic. Pseudorandom bit patterns are scanned into the scan chains so that they can be propagated through the functional logic following the scan chains. The resulting bit patterns are captured in scan chains following the functional logic and then scanned out of these scan chains. An LBIST controller causes functional operations in different portions of the functional logic to be performed at different times during a functional phase of a test cycle. The functional operations may be performed at a normal operating speed, while scan shift operations may be performed at a lower speed.

16 Claims, 9 Drawing Sheets

SYSTEMS AND METHODS FOR LBIST TESTING USING MULTIPLE FUNCTIONAL SUBPHASES

BACKGROUND

1. Field of the Invention

The invention relates generally to the testing of electronic circuits, and more particularly to systems and methods for controlling the execution of LBIST test cycles to reduce the amount of power used by a device under test.

2. Related Art

Digital devices are becoming increasingly complex. As the complexity of these devices increases, there are more and more chances for defects that may impair or impede proper operation of the devices. The testing of these devices is therefore becoming increasingly important.

Testing of a device may be important at various stages, including in the design of the device, in the manufacturing of the device, and in the operation of the device. Testing at the design stage ensures that the design is conceptually sound. Testing during the manufacturing stage may be performed to ensure that the timing, proper operation and performance of the device are as expected. Finally, after the device is manufactured, it may be necessary to test the device at normal operating speeds to ensure that it continues to operate properly during normal usage.

One way to test for defects in a logic circuit is a deterministic approach. In a deterministic method, each possible input pattern is applied at the inputs of the logic circuit, with each possible set of state values in the circuit. The output pattern generated by each set of inputs and state values is then compared with the expected output pattern to determine whether the logic circuit operated properly. If the number of possible input patterns and state values is high, however, the cost of deterministic testing of all the combinations is generally too high for this methodology to be practical. An alternative method of testing that has a lower cost is therefore desirable.

One alternative is a non-deterministic approach in which pseudorandom input test patterns are applied to the inputs of the logic circuit. The outputs of the logic circuit are then compared to the outputs in response to the same pseudorandom input test patterns by a logic circuit that is known to operate properly. If the outputs are the same, there is a high probability that the logic circuit being tested also operates properly. The more input test patterns that are applied to the logic circuits, and the more random the input test patterns, the greater the probability that the logic circuit under test will operate properly in response to any given input pattern. This non-deterministic testing approach is typically easier and less expensive to implement than a deterministic approach.

One test mechanism that can be used to implement a deterministic testing approach is a built-in self test (BIST). This may also be referred to as a logic built-in self test (LBIST) when applied to logic circuits. BIST and LBIST methodologies are generally considered part of a group of methodologies referred to as design-for-test (DFT) methodologies. DFT methodologies impact the actual designs of the circuits that are to be tested. LBIST methodologies in particular involve incorporating circuit components into the design of the circuit to be tested, where the additional circuit components are used for purposes of testing the operation of the circuit's logic gates.

In a typical LBIST system, LBIST circuitry within a device under test includes a plurality of scan chains interposed between levels of the functional logic of the device. Typically, pseudorandom patterns of bits are generated and stored in the scan chains. This may be referred to as scanning the data into the scan chains. After a pseudorandom bit pattern is scanned into a scan chain, the data is propagated through the functional logic to a subsequent scan chain. The data is then scanned out of the subsequent scan chain. This test cycle is typically repeated many times (e.g., 10,000 iterations,) with the results of each test cycle being combined in some manner with the results of the previous test cycles. After all of the scheduled test cycles have been completed, the final result is compared to a final result generated by a device that is known to operate properly. Based upon this comparison, it is determined whether the device under test operated properly.

While this methodology is useful, it requires more power than would normally be consumed by the chip/circuitry. This is because more of the circuitry is active during testing than under typical operating conditions. Therefore, more power must be provided to the chip. In order to provide this power, a great deal of on-chip capacitance is required. The more capacitance that is necessary, the larger (and more expensive) the chip must be.

It would therefore be desirable to provide systems and methods for performing LBIST testing that require less power than conventional systems and methods.

SUMMARY OF THE INVENTION

One or more of the problems outlined above may be solved by the various embodiments of the invention. Broadly speaking, the invention comprises systems and methods for performing logic built-in-self-tests (LBISTs) in digital circuits, where the LBIST circuitry is configured to propagate data through different portions of the functional logic of the circuits at different times.

In one embodiment, a STUMPS-type LBIST test architecture is incorporated into the design of a logic circuit. The LBIST components include a set of scan chains interposed between portions of the functional logic of the logic circuit. Pseudorandom bit patterns are scanned into the scan chains so that the pseudorandom bit patterns can be propagated through the functional logic following the scan chains. The resulting bit patterns are captured in scan chains following the functional logic and then scanned out of these scan chains. An LBIST controller causes functional operations in different portions of the functional logic to be performed at different times (i.e., in different subphases of the functional phase.) For example, in one embodiment, the functional logic is divided into four portions, and data is propagated through only one of the four portions at a time. As a result, during the functional subphases, only about one fourth of the power required in the functional phase of a conventional LBIST system is needed.

One alternative embodiment comprises a method including performing one or more test cycles of an LBIST system, where each test cycle includes a scan shift phase and multiple functional subphases. In each functional subphase, data is propagated through a different portion of the functional logic of the device under test. In one embodiment, operations during the functional subphases are performed at the normal operating speed (clock rate) of the device, while operations during the scan shift phase are performed at a slower speed. In one embodiment, the functional operations are performed in the different portions of the functional logic at different times by selectively providing a clock signal to the different portions, thereby enabling operations in some portions and disabling operations in others.

Another alternative embodiment comprises a system including functional logic in a device under test interposed with a plurality of scan chains, and an LBIST controller. The LBIST controller is coupled to the functional logic and scan chains and is configured to cause data to propagate from the scan chains through the functional logic in a functional phase of a test cycle. The data is propagated through different portions of the functional logic in different subphases of the functional phase. In one embodiment, the LBIST controller is configured to cause the functional operations to be performed at a normal operating speed of the device under test, while scan shift operations are performed at a lower speed. In one embodiment, the LBIST controller uses control signals to selectively enable or inhibit functional operations in the different portions of the functional logic. A set of shift registers are used in one embodiment to select the portions of the functional logic in which to enable functional operations in each functional subphase.

Yet another alternative embodiment comprises a device including an LBIST controller configured to selectively enable functional operations in different portions of a device under test at different times.

Numerous additional embodiments are also possible.

BRIEF DESCRIPTION OF THE DRAWINGS

Other objects and advantages of the invention may become apparent upon reading the following detailed description and upon reference to the accompanying drawings.

FIG. 10 is a diagram illustrating an alternative structure for an LBIST system in accordance with one embodiment.

Figure 1:
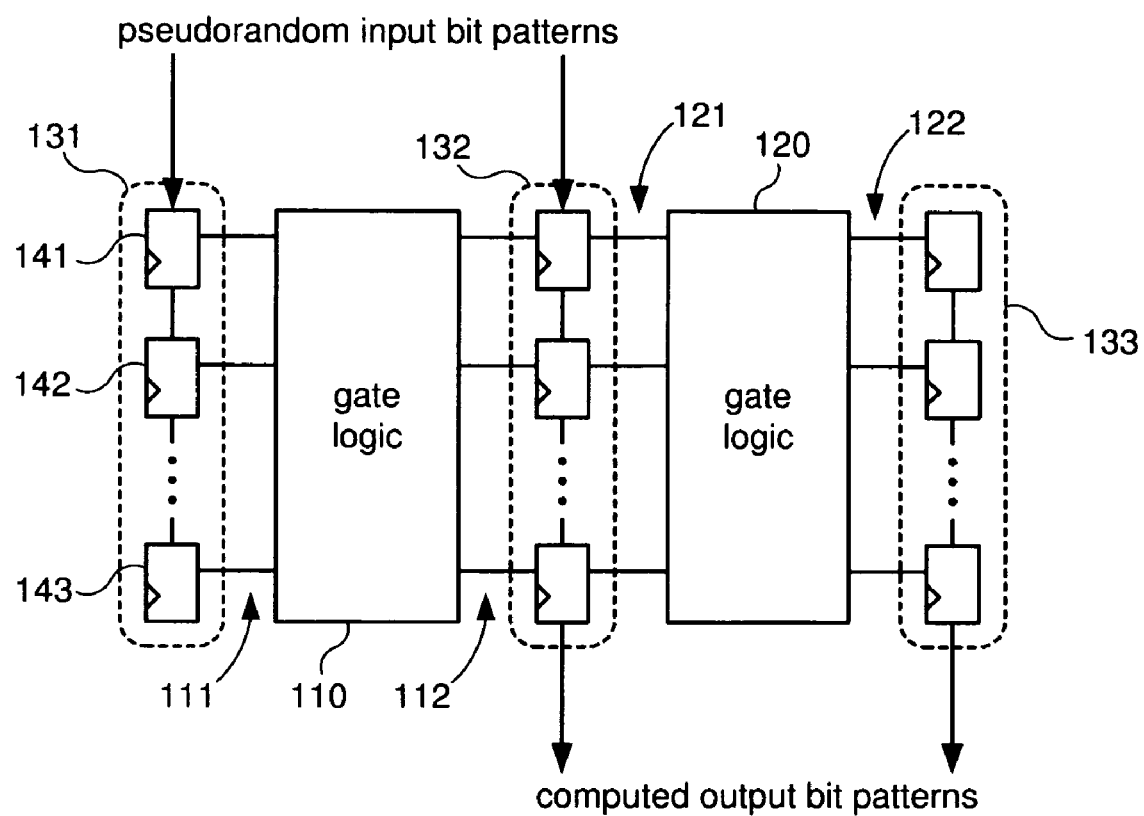
FIG. 1 is a functional block diagram illustrating the principal operation of a simple STUMPS LBIST system.

While the invention is subject to various modifications and alternative forms, specific embodiments thereof are shown by way of example in the drawings and the accompanying detailed description. It should be understood, however, that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for performing logic built-in-self-tests (LBISTs) in digital circuits, where different blocks of functional logic of the LBIST circuitry are tested during different portions of each test cycle.

In one embodiment, a STUMPS-type LBIST test architecture is incorporated into the design of a logic circuit. The LBIST components include a set of scan chains interposed between portions of the functional logic of the logic circuit. Pseudorandom bit patterns are scanned into the scan chains so that the pseudorandom bit patterns can be propagated through the functional logic following the scan chains. The resulting bit patterns are captured in scan chains following the functional logic and then scanned out of these scan chains.

The LBIST circuit performs functional operations in different portions of the functional logic at different times. For example, in one embodiment, the functional logic is divided (operationally, rather than physically) into four blocks, and data is propagated through only one of the four blocks at a time. As a result, during the functional subphases, only about one fourth of the power required in the functional phase of a conventional LBIST system is needed. (The functional logic may be divided into different numbers of blocks, or uneven blocks, if desired.)

The various embodiments of the invention may provide a number of advantages over conventional systems. For example, the power consumed by the circuit under test during the functional phase of LBIST testing is reduced. This reduces the power needed to be supplied by the testing equipment, and obviates the need for more expensive testing equipment (reducing the cost of acquiring or modifying testing equipment). The reduction in power consumption may also reduce the amount of heat to be dissipated, thus reducing such demands of the testing equipment and reducing the possibility of damaging the chip as a result of the heat.

Various embodiments of the invention will be described below. Primarily, these embodiments will focus on implementations of a STUMPS-type LBIST architecture which is implemented within an integrated circuit. It should be noted that these embodiments are intended to be illustrative rather than limiting, and alternative embodiments may be implemented in BIST architectures other than the STUMPS architecture, and may also be implemented in circuits whose components are not strictly limited to logic components (e.g., AND gates, OR gates, and the like). Many such variations will be apparent to persons of ordinary skill in the art of the invention and are intended to be encompassed by the appended claims.

Referring to FIG. 1, a functional block diagram illustrating the principle of operation of a simple STUMPS LBIST system is shown. The LBIST system is incorporated into an integrated circuit. In this figure, the functional logic of the integrated circuit includes a first portion 110 and a second portion 120. Functional logic 110 is, itself, a logic circuit having a plurality of inputs 111 and a plurality of outputs 112. Similarly, functional logic 120 forms a logic circuit having a plurality of inputs 121 and a plurality and outputs 122. Functional logic 110 is coupled to functional logic 120 so that, in normal operation, outputs 112 of functional logic 110 serve as inputs 121 to functional logic 120.

Each of the inputs to, and outputs from, functional logic 110 and 120 is coupled to a scan latch. The set of scan latches 131 that are coupled to inputs 111 of functional logic 110 is referred to as a scan chain. The latches are serially coupled together so that bits of data can be shifted through the latches of a scan chain. For example, a bit may be scanned into latch 141, then shifted into latch 142, and so on, until it reaches latch 143. More specifically, as this bit is shifted from latch 141 into latch 142, a second bit is shifted into latch 141. As a bit is shifted out of each latch, another bit is shifted into the latch. In this manner, a series of data bits can be shifted, or scanned, into the set of latches in scan chain 131, so that each latch stores a corresponding bit. Data can likewise be scanned into the latches of scan chain 132.

Just as data can be scanned into the latches of a scan chain (e.g., 131,) data can be scanned out of the latches of a scan chain. As depicted in FIG. 1, the latches of scan chain 132 are coupled to the outputs of functional logic 110. Each of these latches can store a corresponding bit that is output by functional logic 110. After these output bits are stored in the latches of scan chain 132, the output data bits can be shifted through the series of latches and provided as a computed output bit stream. Data can likewise be scanned out of the latches of scan chain 133. It should be noted that the structure illustrated in FIG. 1 does not show data being scanned into scan chain 133, or data being scanned out of scan chain 131. Alternative embodiments may be configured to scan data in and out of these scan chains.

The LBIST system of FIG. 1 operates basically as follows. Pseudorandom bit patterns are generated and are scanned into the scan chains (131, 132) that are coupled to the inputs of functional logic 110 and 120. The pseudorandom bit patterns that are stored in scan chains 131 and 132 are then propagated through the corresponding functional logic. That is, the bit pattern in scan chain 131 is propagated through functional logic 110, while the bit pattern in scan chain 132 is propagated through functional logic 120. Functional logic 110 and 120 process the inputs and generate a corresponding set of outputs. These outputs are captured (stored) in the scan chains (132 and 133) that are coupled to the outputs of the functional logic. The output bit patterns stored in scan chains 132 and 133 are then scanned out of these scan chains.

Figure 2:
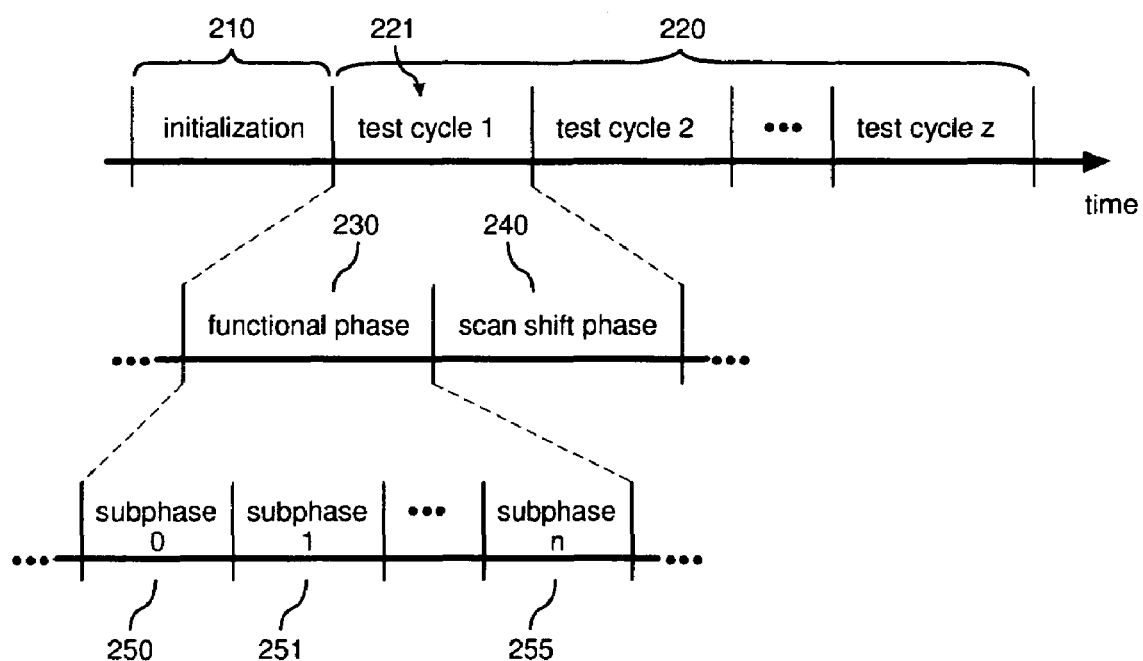
FIG. 2 is a diagram illustrating the phases of operation of the LBIST system in accordance with one embodiment.

Referring to FIG. 2, a diagram illustrating the phases of operation of an LBIST system in accordance with one embodiment is shown. As depicted in this figure, operation of the LBIST system begins with an initialization phase (210). In the initialization phase, the various components of the system are prepared for operation. This may include resetting various components, providing a seed for the pseudorandom number generator, setting values in registers, and so on. Initialization phase 210 is followed by a test phase (220) consisting of a series of test cycles (test cycle 1 through test cycle z). There may be a finalization phase (not shown in the figure) after all of the test cycles are completed.

In each test cycle (e.g., 221), there is a functional phase (e.g., 230) and a scan shift phase (e.g., 240). In the functional phase, data is propagated from one or more of the scan chains, through the functional logic of the device in which the LBIST system is implemented, and into one or more other scan chains. In the scan shift phase, data is scanned into and out of the scan chains of the LBIST system.

Because each test cycle in the embodiment depicted in FIG. 2 begins with a functional phase, it is necessary during the initialization phase to generate a first set of pseudorandom bit patterns and to load these bit patterns into the scan chains that are interposed between the functional logic of the device under test. After these operations are performed, the LBIST system is ready for operation. Alternatively, if each test cycle begins with a scan shift phase, data need not be scanned into the scan chains prior to the first test cycle, but the data captured at the end of the last test cycle will need to be scanned out of the scan chains during the finalization phase.

During the functional phase, the data that was scanned into the scan chains is propagated through the functional logic of the device under test. The functional operations in this phase may, for example, be performed at the normal operating speed of the chip (e.g., 1 Ghz.) After the data is propagated through the functional logic, the output of the functional logic is captured by the scan chains. As noted above, a scan chain that is positioned between successive portions of the functional logic serves to both provide inputs to the portion that precedes the scan chain and capture the outputs of the portion that follows the scan chain. The data that is captured in the scan chains at the end of the functional phase is scanned out of the scan chains during the scan shift phase. At the same time the captured data is scanned out of the scan chains, new pseudorandom bit patterns are scanned into the scan chains to prepare for the functional phase of the next test cycle. The scan shift operations in this phase may be operated at the normal/nominal/typical operating speed of the chip or at a different rate (e.g., a reduced rate to reduce power consumption).

As shown in FIG. 2, the operations in functional phase 230 are performed in subphases (250, 251, 255). Each of the subphases is associated with a corresponding block of the functional logic. In one embodiment, there are n blocks of functional logic that can be separately caused to perform the functional phase of a test cycle. In this embodiment, block 0 is active during subphase 0 (250), block 1 is active during subphase 1 (251), and so forth, with block n-1 active during the last subphase, subphase n-1 (255). For example, if n=4, a first block is active during a first subphase (250), a second block is active during a second subphase (251), a third block is active during a third subphase, and a fourth block is active during a fourth subphase (255). In another embodiment, there are four blocks of functional logic and two functional subphases, with blocks 0 and 2 active during the first subphase, and blocks 1 and 3 active during the second subphase. Other embodiments may use other combinations and orderings, as may be desired or necessary.

The data that was captured in the scan chains can be processed and examined to determine whether the functional logic blocks performed correctly. In one embodiment, the captured data from all of the scan chains in the system is compacted and provided to a multiple input signature register (MISR). The compacted data is combined with data already stored in the MISR to produce a new signature value in the MISR. Typically, this is repeated for each of a predetermined number of test cycles (e.g., 10,000,) and the resulting signature value is compared with a known value generated by a good chip. If the signature values match, the device under test has functioned properly. If the signature values do not match, the device under test has malfunctioned. (Although the comparison is performed in this embodiment after many test cycles, it may be performed after several test cycles, or even after each test cycle, in other embodiments.

Figure 3:
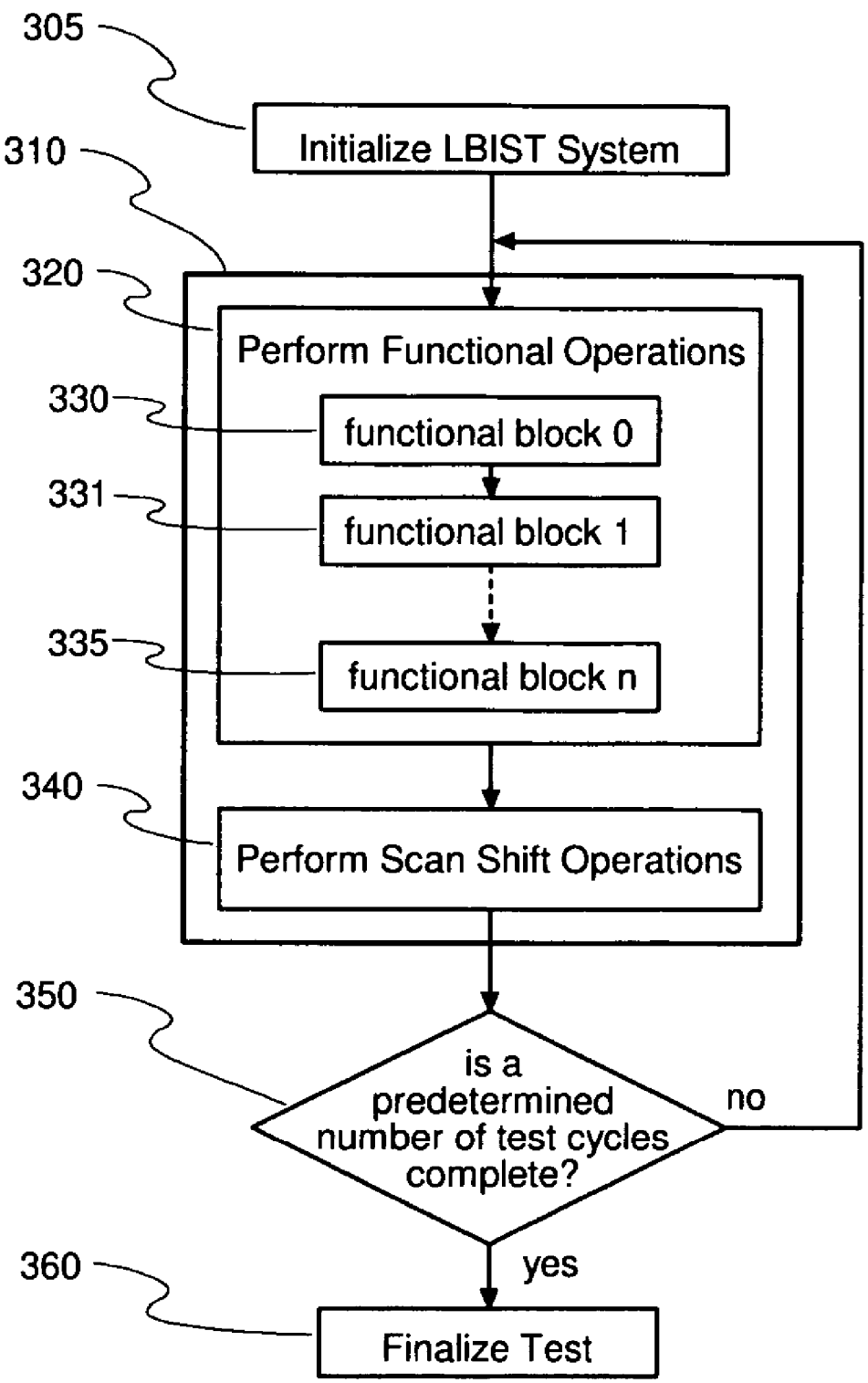
FIG. 3 is a flow diagram illustrating the initialization of an LBIST system and the performance of repeating test cycles in accordance with one embodiment.

The operation of the LBIST system of one embodiment is summarized in FIG. 3. FIG. 3 is a flow diagram illustrating the initialization of the system (305) and the repeating test cycles 310 (including functional phase 320 and scan shift phase 340).

Referring to FIG. 3, operation of the system begins with the initialization of the LBIST components (block 305.) During the initialization phase, an initial bit pattern is scanned into the scan chains. After the system is initialized, it enters a functional phase, in which data is propagated from the scan chains through the functional logic and the resulting bit patterns are captured in the scan chains. The operations of the functional phase 320 are performed in blocks. First, data is propagated through block 0 (330), then block 1 (331), and do on through all of the blocks of functional logic, including block n (335).

Next, the system executes the scan shift phase. In this phase, the captured bit patterns are scanned out of the scan chains while new pseudorandom bit patterns are scanned into the scan chains (block 340.) After the test cycle is completed, the system determines whether all of the predetermined number of test cycles has been completed. If not, execution of the LBIST testing will continue with a subsequent test cycle (block 350). If all of the test cycles have been performed, the testing is finalized (block 360).

Figure 4A:
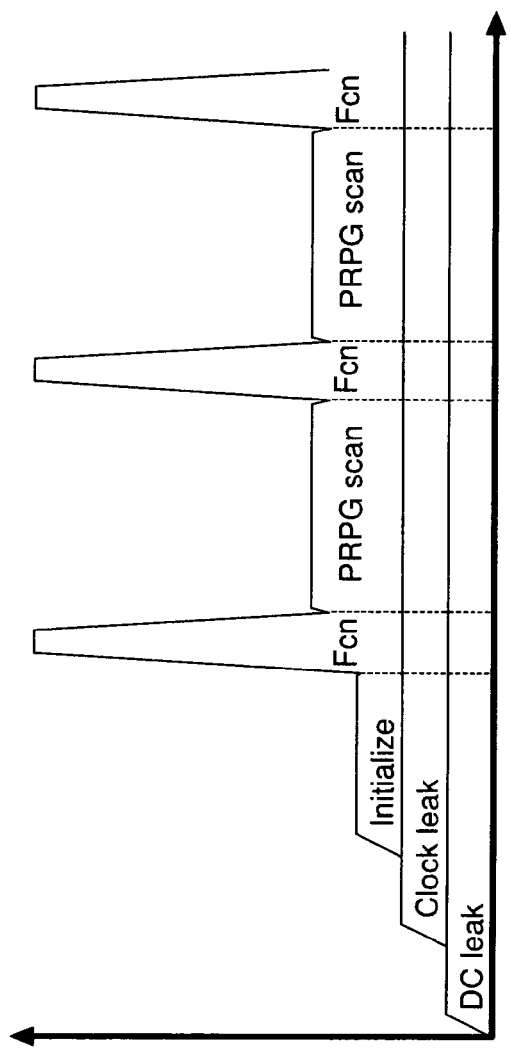
FIGS. 4A and 4B are a pair of diagrams illustrating the effect of performing functional operations of different blocks of the functional logic in multiple subphases in accordance with one embodiment.
Figure 4B:
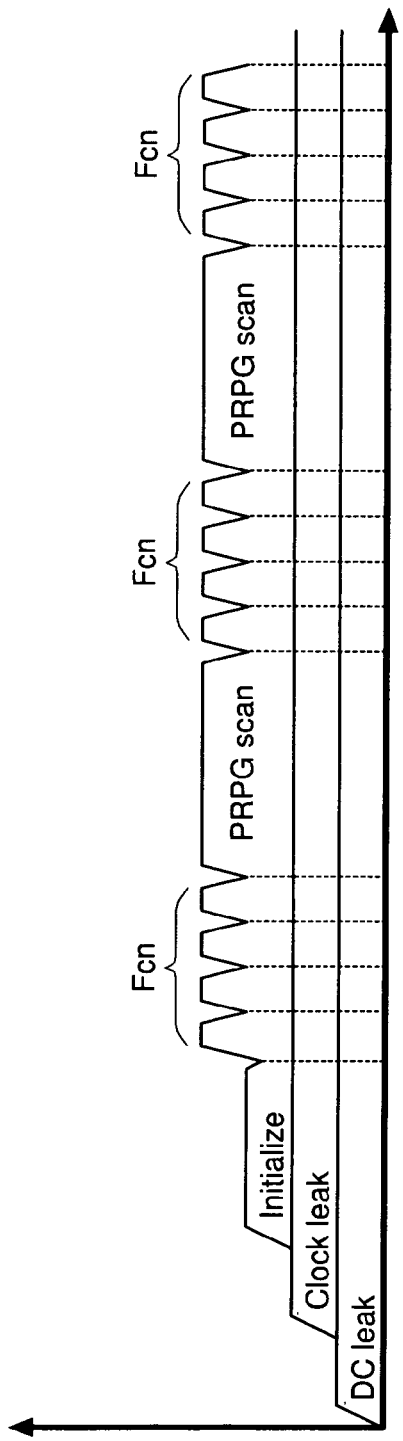

Referring to FIGS. 4A and 4B, a pair of diagrams illustrating the effect of performing functional operations of different blocks of the functional logic in multiple subphases are shown. FIG. 4A shows the amount of power used by an LBIST system that performs functional operations in all of the functional logic at the same time. It can be seen that there is a baseline amount of power that is attributable to DC leakage and clock leakage in the device under test. During the initialization phase, the amount of power that is used is relatively minimal. By contrast, a great deal of power is required for each functional (Fcn) phase. Then, during the scan shift (PRPG Scan) phase, the required power is much lower.

It should be noted that the difference in power requirements between the functional and scanned phases results, in part, from the fact that it is desirable to perform the functional operations of the functional phase at the normal operating speed of the device under test. The operations of the scan phase, the other hand, can be performed at a reduced speed, thereby requiring less power (and taking longer to complete.) FIGS. 4A and 4B assume that functional operations are performed at the normal operating speed of the device under test, and that scan shift operations are performed at a reduced speed.

Referring to FIG. 4B, the amount of power used by an LBIST system in accordance with one embodiment is shown. Again, there is a baseline amount of DC and clock leakage. The functional, scan shift and other operations are added to this baseline amount of power. It can be seen that the power required for the initialization and scan shift phases are essentially the same as for the corresponding phases of FIG. 4A. The power requirements for the functional phase, however, is much lower because the functional operations are performed in a series of subphases. As depicted in the figure, the functional phase is implemented in four subphases, so the power is reduced to approximately one-fourth of the power required in FIG. 4A.

It should be noted that the embodiment depicted in FIGS. 2 and 3 allows for a variable number of functional blocks and corresponding subphases that can be implemented in a variety of ways. The following exemplary embodiment illustrates LBIST circuitry which includes a Clock Control Block and a Hold Control Block. This circuitry produces gating signals that cyclically enable a series of blocks of functional logic. Alternative embodiments may control the execution of the functional blocks in a different manner.

Figure 5:
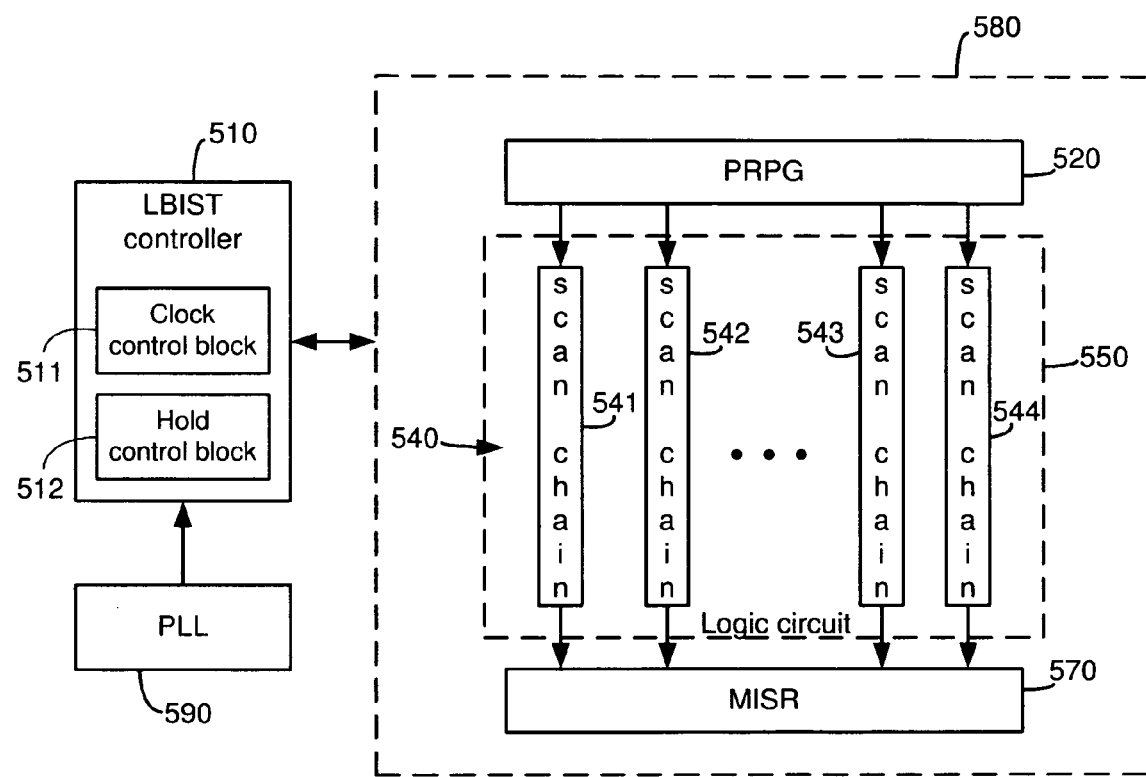
FIG. 5 is a functional block diagram illustrating an LBIST architecture that can be used in conjunction with the testing of logic circuits in accordance with one embodiment.

In one embodiment, the LBIST system is implemented as shown in the functional block diagram of FIG. 5. As depicted in FIG. 5, the STUMPS architecture includes an LBIST controller 510, a PLL 590, a PRPG 520, a set of scan chains 540 and a MISR 570. These LBIST components are integrated with a logic circuit 550, which the LBIST components are designed to test.

It should be noted that the LBIST circuitry in this embodiment is handled in multiple blocks. For instance, one block consists of PRPG 521, scan chains 541 and 542, and MISR 571, while another block consists of PRPG 522, scan chains 543 and 544, and MISR 572. (It should be noted that, while the PRPG and MISR are separate for each of the blocks in this embodiment, this is not necessarily true of other embodiments, in which there may be a single PRPG and a single MISR that are used for all of the blocks.) There may be any number of these blocks. Similarly, there may be additional scan chains within each of the blocks. The different blocks need not be identically configured, and may have different numbers of scan chains, different amounts of functional logic between the scan chains, and so on. It should also be noted that a single scan chain can serve as the initial scan chain of one block and the final scan chain of another block.

LBIST controller 510 includes control circuitry that controls the operation of the remainder of the LBIST components 580, including clock control block 511 and hold control block 512. (For purposes of clarity, LBIST controller 510 is depicted as being coupled to LBIST components 580 as a group, although the controller is typically coupled directly to each of the components.) LBIST controller 510 provides signals to LBIST components 580 to control the operation of these components. LBIST controller 510 therefore determines the manner in which the LBIST circuitry is initialized, the manner in which this circuitry operates in the functional and scan shift phases, and the manner in which the testing implemented by the circuitry is finalized.

PRPG 520 (or each of PRPG sub-blocks 521-522) typically receives a seed value from LBIST controller 510 and generates a pseudorandom sequence of bits that are loaded into scan chains 540. Each of scan chains 540 comprises a series of scan latches that are configured to alternately shift data (the pseudorandom bit patterns or functional logic output) through the scan chains or to hold data that has been propagated through the functional logic.

Each of scan chains 540 is positioned before or after (interposed with) respective portions of logic circuit 550. Thus, for each portion of logic circuit 550, there is a scan chain which precedes this portion and provides inputs to the corresponding logic, as well as a scan chain which follows this portion and receives the output of the corresponding logic. For example, one portion of logic circuit 550 may receive input bits from scan chain 541 and provide output bits to scan chain 542. Another portion of logic circuit 550 may receive input bits from scan chain 543 and provide output bits to scan chain 544. Some of scan chains 540 may serve both to provide input bits to a succeeding portion of logic circuit 550 and to receive output bits from a preceding portion of logic circuit 550.

After the pseudorandom bit patterns have been allowed to propagate through the functional components of logic circuit 550 and the results have been captured in scan chains 540, the contents of scan chains 540 are scanned out of the scan chains (i.e., they are unloaded from the scan chains) to MISR 570 (or MISR sub-blocks 571-572).

MISR 570 updates the current value in the MISR according to the data scanned out of the scan chains (e.g., by performing a modulo operation—dividing the current value by the value received from the scan chains and retaining the remainder.) The value stored in MISR 570 can then be compared to an expected value. If the stored value does not match the expected value, then one or more of the operations performed by the functional components of logic circuit 550 failed, thereby providing an incorrect data bit in the output scan chain, which was then propagated to MISR 570.

One of the functions of LBIST controller 510 is to generate the control signals necessary to execute the phases of operation depicted in FIG. 2 (i.e., the initialization, functional subphases and scan shift phases.) The generation of these control signals is performed in one embodiment by an LBIST controller as depicted in FIG. 6.

Figure 6:
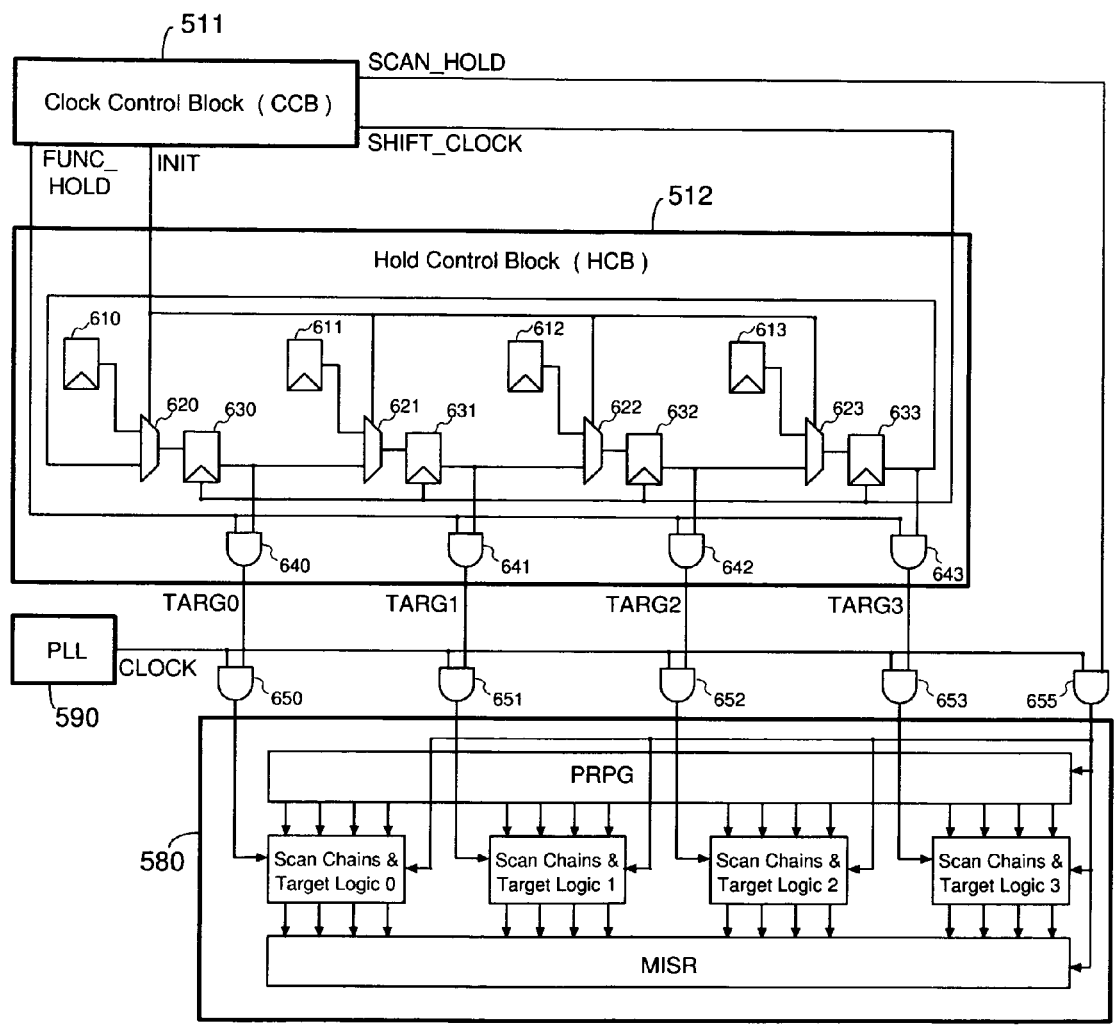
FIG. 6 is a functional block diagram illustrating the structure of an LBIST controller in accordance with one embodiment.
Figure 7:
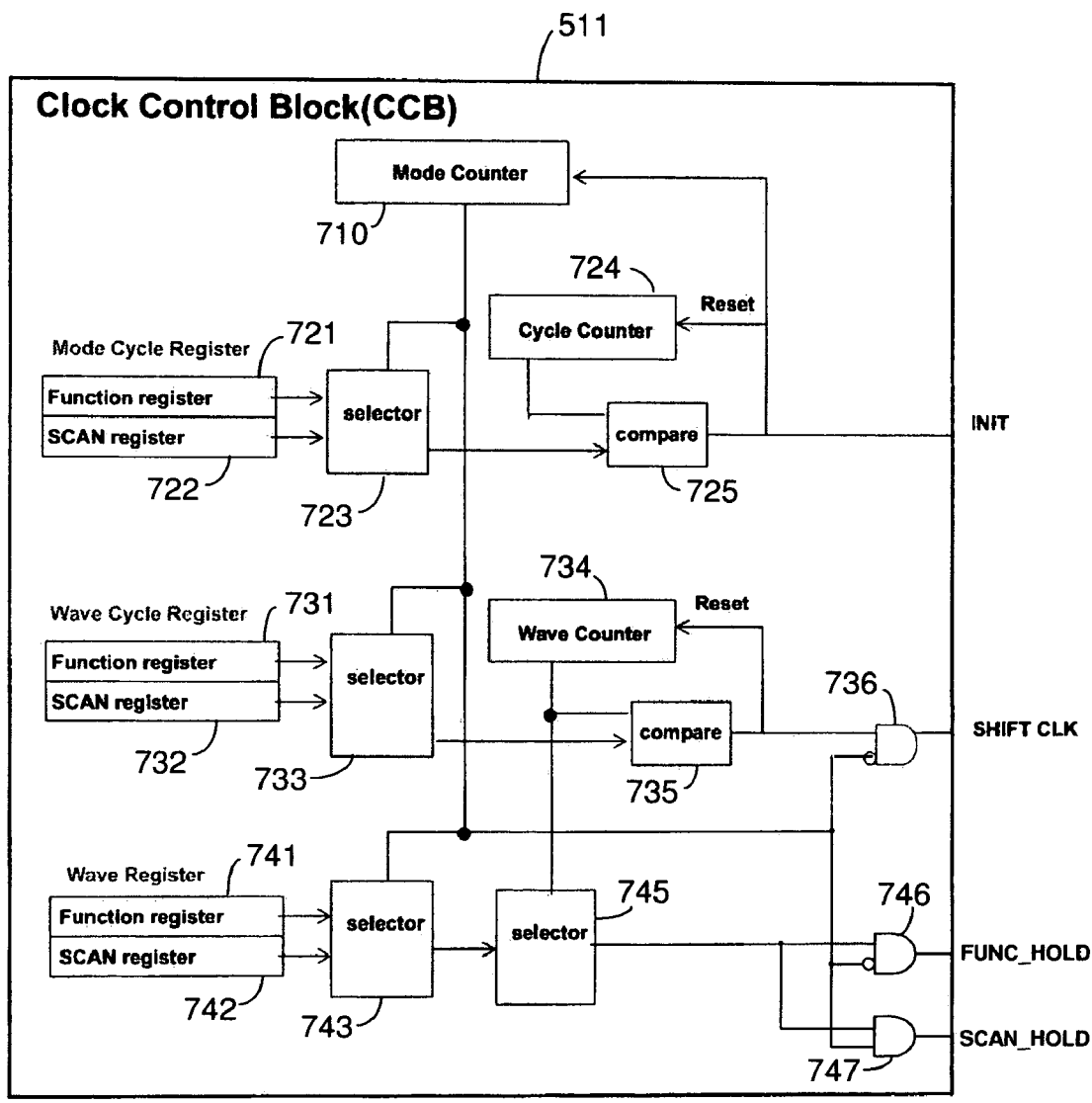
FIG. 7 is a functional block diagram illustrating the structure of a clock control block in accordance with one embodiment.

Referring to FIG. 6, a functional block diagram illustrating the structure of the LBIST controller in accordance with one embodiment is shown. In particular, FIG. 6 shows the detail of hold control block 512. FIG. 7, which will be described below, shows the detail of clock control block 511.

As shown in FIG. 6, clock control block 511 generates four signals that are provided to hold control block 512. The signals are the FUNC_HOLD, SCAN_HOLD, INIT and SHIFT_CLOCK signals. The INIT signal is asserted to initialize hold control block 512. The FUNC_HOLD signal is used to assert a set of separate target signals (TARG0, TARG1, . . . ) that enable or inhibit the LBIST circuitry for the different blocks of functional logic within the device under test. The SCAN_HOLD signal is used to enable or inhibit the clock signal from PLL 590 to the PRPG and MISR circuitry. The SHIFT_CLOCK signal is used to shift the states of the target signals produced by hold control block 512.

It can be seen that hold control block 512 includes four latches (630-633,) where the output of each latch is provided to one of the inputs of a corresponding AND gate (640-643.) When the output of one of the latches is high and the FUNC_HOLD signal from clock control block 511 is asserted, the output of the corresponding AND gate (the target signal) is also asserted. Each target signal is provided to one of the inputs of another corresponding AND gate (650-653.) The other inputs to each of AND gates 650-653 is a clock signal provided by PLL 590. Thus, each target signal (TARG0-TARG3) is used to gate the clock signal from PLL 590 to the scan chains and functional logic of the respective block of the LBIST circuitry. In other words, if one of the target signals is high, the clock signal from PLL 590 is passed through the corresponding one of AND gates 650-653 to the scan chains and functional logic in the associated portion of the LBIST circuitry.

The gating of the clock signal to the different blocks of the LBIST circuitry is controlled by the FUNC_HOLD signal generated by clock control block 511 and the values stored in shift latches 630-633. The FUNC_HOLD signal determines when the clock signal of PLL 590 will be passed through to the LBIST circuitry, while the values in latches 630-633 determine which portion of the LBIST circuitry will receive the clock signal. If it is desired for only one of the blocks to be active at a time during the functional phase, only one of these latches should hold a 1, while the others should hold 0's. If it is desired to have two blocks of active at the same time, then two of the latches should hold 1's, while the others hold 0's. These values are shifted from one latch to another in order to activate the different functional blocks during the different subphases of the functional phase.

The shifting of the values in latches 630-633 is accomplished through the use of multiplexers 620-623. Each of the multiplexers has two inputs. One of the inputs is coupled to a corresponding one of registers 610-613, while the other of the inputs is coupled to the output of a preceding one of shift latches 630-633. For example, the inputs of multiplexer 620 are coupled to register 610 and latch 633. When the initialization signal from clock control block 511 (INIT) is not asserted, each multiplexer passes through the output of the preceding latch to the input of the following latch (e.g., from the output of latch 633 to the input of latch 630.) When the initialization signal from clock control block 511 (INIT) is asserted, each multiplexer selects the corresponding one of registers 610-613. These registers store the initial values that are to be loaded into the latches when the system is initialized. For example, if only one block is to be active during each functional subphase, one of registers 610-613 will store a 1, while the others store 0's. The initial values from registers 610-613 or the values from the preceding latches are shifted into latches 630-633 with each pulse of the SHIFT_CLOCK received from clock control block 511.

As described above, the clock signal of PLL 590 is provided during the functional subphases to alternate blocks of functional logic according to the target signals, TARG0-TARG3. During the scan shift phase, the FUNC_HOLD signal is not asserted, so none of the target signals is asserted, and the clock signal is not provided to any of the blocks of functional logic. During the scan shift phase, the SCAN_HOLD signal is asserted to pass the clock signal from PLL 590 to the scan chains, PRPG(s) and MISR(s) to enable the shifting of data into and out of the scan chains. The clock signal is gated in this manner by providing the clock signal and the SCAN_HOLD signal to AND gate 655. In one embodiment, the SCAN HOLD signal is asserted every few clock cycles (e.g., every fourth cycle) in order to reduce the rate at which data is scanned through the scan chains, and thereby reduce the power required by these scan operations.

Referring to FIG. 7, a functional block diagram illustrating the structure of the clock control block in accordance with one embodiment is shown. The illustrated embodiment is configured to generate the INIT, SHIFT_CLOCK, SCAN_HOLD and FUNC_HOLD signals that are used by the hold control block of FIG. 6.

The first component of clock control block 511 is a mode counter, 710. Mode counter 710 indicates the mode (functional phase or scan shift phase) in which the LBIST circuitry is currently operating. In this embodiment, mode counter 710 simply counts from 0 to 1, and is then reset back to 0 (i.e., it alternates between values of 0 and 1.) The value of mode counter 710 is provided to selectors 723, 733 and 743. Based upon the value stored in mode counter 710, each of these selectors selects one of a corresponding set of registers. If mode counter 710 indicates a functional phase, selector 723 selects register 721, selector 733 selects register 731, and selector 743 selects register 741. If mode counter 710 indicates a scan shift phase, selector 723 selects register 722, selector 733 selects register 732, and selector 743 selects register 742.

Registers 721, 722, 731, 732, 741 and 742 store values that indicate the number of cycles to which a corresponding counter (e.g., 724 or 734) will count before a corresponding signal (e.g., INIT, SHIFT_CLOCK, FUNC_HOLD or SCAN_HOLD) is asserted. The appropriate value is selected by the corresponding one of selectors 723, 733 and 743 and provided to the corresponding one of comparators 725, 735 or selector 745. Comparators 725 and 735 compare the values received from the selectors with the values of the corresponding counters and assert an output signal when these values match. Selector 745 selects the value of the bit indicated by the counter and provides this value as an output signal.

Components 721-725 are used to generate the INIT signal which initializes the latches of the hold control block as described in FIG. 6. Register 721 stores the total number of cycles in each functional phase (including all of the subphases) of a test cycle. Register 722 stores the number of cycles that are in the scan shift phase of the test cycle. If mode counter 710 indicates the functional phase, selector 723 selects the value from register 721. If mode counter 710 indicates the scan shift phase, selector 723 selects the value from register 722. In either case, the selected value is provided to comparator 725. The selected value is compared to the value of cycle counter 724. When the value of cycle counter 724 matches the value provided by selector 723, comparator 725 asserts an output signal. This output signal is provided as the INIT signal of clock control block 511, and is also used within the clock control block both to reset cycle counter 724 and to increment mode counter 710.

Components 731-736 are used to generate the SHIFT_CLOCK signal that is used to shift the values within the latches of the hold control block (see items 630-633 of FIG. 6.) Register 731 stores the number of cycles in each functional subphase. Register 732 stores a number of cycles corresponding to a repeating pattern of bits that that are used to generate the FUNC_HOLD signal, as will be discussed below. If mode counter 710 indicates the functional phase (i.e., the mode counter value is 0,) selector 733 selects the value from register 731. If mode counter 710 indicates the scan shift phase (i.e., the mode counter value is 1,) selector 733 selects the value from register 732. The value selected by selector 733 is provided to comparator 735. The selected value is compared to the value of wave counter 734, and an output signal is asserted when the value of wave counter 734 matches the value provided by selector 733. This output signal resets wave counter 734, and is also provided to AND gate 736. AND gate 736 also receives the value of mode counter 710 as an input. In the functional phase (when the value of mode counter 710 is 0) and the output of comparator 735 is asserted, the SHIFT_CLOCK signal is also asserted. In the scan shift phase, the value of mode counter 710 is 1, so the output of AND gate 736 (i.e., the SHIFT_CLOCK signal) is not asserted.

Components 741-743, 734 and 745-747 are used to generate the FUNC_HOLD and SCAN_HOLD signals that are provided to the hold control block. Registers 741 and 742 are used to store bit patterns that represent the FUNC_HOLD signal during each functional subphase and each portion of the scan shift phase. The number of bits of each value in registers 741 and 742 that are used to generate the FUNC_HOLD and SCAN_HOLD signals are determined by the number of cycles that are counted by wave counter 734. If, for example, wave counter 734 counts three cycles in each functional subphase (as determined by the value in register 731,) three bits of the value in register 741 will be used to generate the FUNC_HOLD signal. During the scan shift phase, a different number of cycles may be counted by wave counter 734 (as determined by the value in register 732.) Selector 745 receives the value from one of registers 741 or 742 and, as wave counter 734 counts each cycle, selector 745 provides the corresponding bit of the selected value as the FUNC_HOLD or SCAN_HOLD signal. For instance, if the value stored in register 731 is 3, and the first three bits of the value in register 741 are "110", the FUNC_HOLD signal will be 1 during the first two cycles, then 0 during the third cycle, then 1 during the next two cycles, and so on. It should be noted that AND gate 747 receives the mode counter value as an input, while AND gate 746 receives the inverse of this value, so that only one of signals SCAN_HOLD and FUNC_HOLD is asserted at a time.

Figure 8:
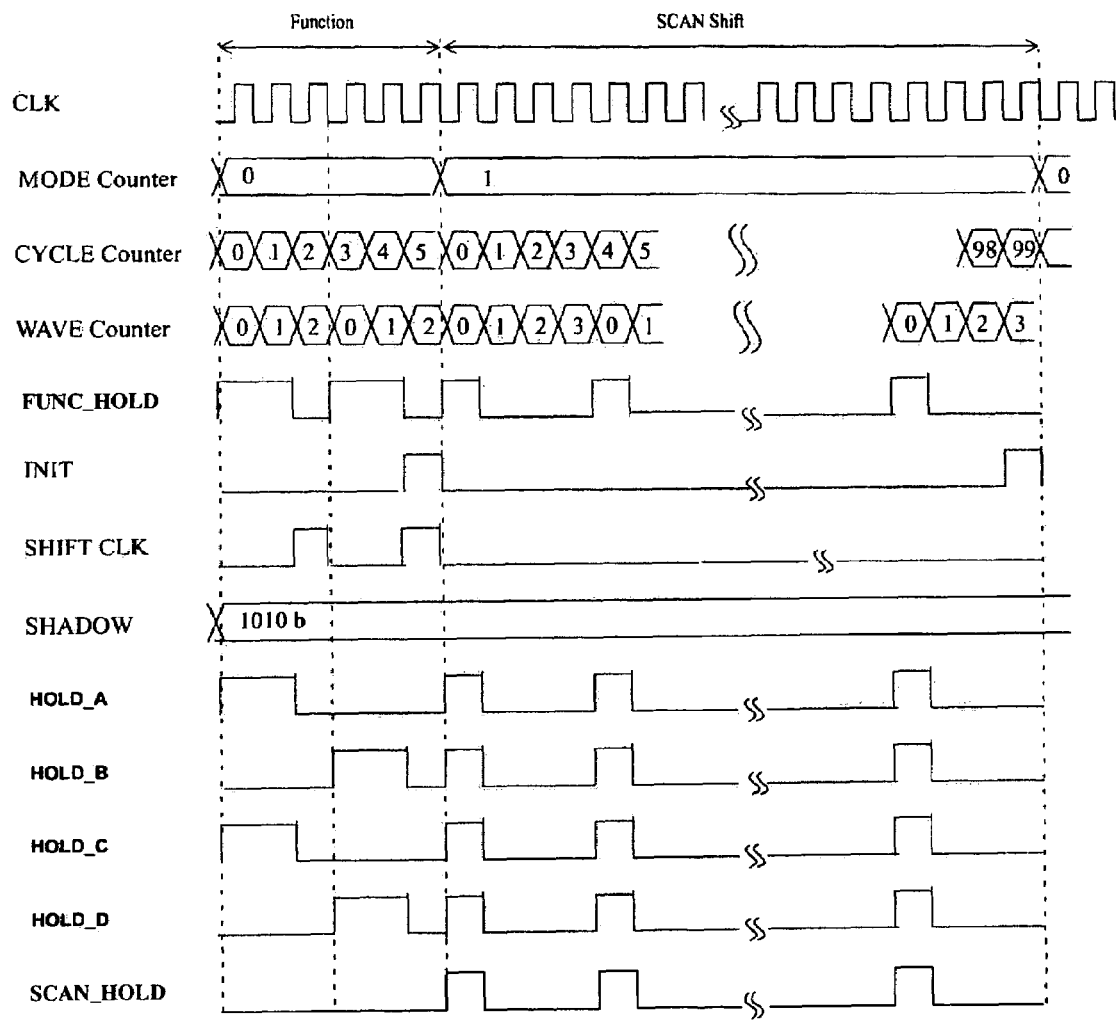
FIG. 8 is a timing diagram illustrating register values and signals associated with one embodiment.

Referring to FIG. 8, a timing diagram illustrating some of the register values and signals discussed above is shown. FIG. 8 corresponds to an embodiment in which there are four separately controllable blocks of LBIST circuitry. In this embodiment, the initialization registers of the hold control block (see 610-613 of FIG. 6) store "1010". That is, the first and third registers store 1's, and the second and fourth registers store 0's. Consequently, there are two functional subphases. During one subphase, the first and third blocks of the LBIST circuitry are active, while the second and fourth blocks are inactive. During the other subphase, the second and fourth blocks of the LBIST circuitry are active, and the first and third blocks are inactive.

In the embodiment of FIG. 8, the functional mode cycle register (see 721) stores the value 5, while the scan shift mode cycle register (see 722) stores the value 99. Thus, there are six cycles (counting from 0-5) in the functional phase 100 cycles in the scan shift phase. The functional wave cycle register (see 731) stores the value 2, so there are three cycles in each functional subphase. The scan shift wave cycle register (see 732) stores the value 3, so the pattern of the FUNC_HOLD signal during the scan shift phase repeats every four cycles.

The values of the mode counter (see 710,) cycle counter (see 724) and wave counter (see 734) are shown in the upper portion of FIG. 8. When the value of the mode counter is 0, the LBIST circuitry is in the functional phase. When the mode counter is 1, the LBIST circuitry is in the scan shift phase. During each functional phase, the cycle counter counts from 0 to 5. During each scan shift phase, the cycle counter counts from 0 to 99. During each functional subphase, the wave counter counts from 0 to 2. During each scan shift phase, the wave counter counts from 0 to 3, then returns to 0 and repeats the count from 0 to 3 until the end of the scan shift phase.

When the cycle counter reaches the value of the selected mode cycle register (5 in the functional phase and 99 in the scan shift phase,) the output of the comparator (725) is asserted. This increments the mode counter to change the mode (from functional to scan shift, or vice versa.) This signal is also used as the INIT signal. When this signal is asserted, the initialization registers (610-613) are reloaded into the shift registers (630-633,) to initialize their values for the next phase.

As the wave counter counts from 0 to the value of the selected register (in this case, 2 for the functional wave cycle register and 3 for the scan shift wave cycle register,) the FUNC_HOLD signal is asserted according to the bits stored in the corresponding wave register (741 or 742.) As depicted in FIG. 8, the functional wave register holds a value that begins with "110", so the hold signal is asserted for two cycles and then deasserted for one cycle during each functional subphase. Data is therefore propagated through the selected block(s) of the functional logic for two cycles at the base clock rate during each functional subphase.

Because shift registers 630-633 initially hold the bits "1010", signals TARG0 and TARG2 are asserted during the first functional subphase and data is propagated through the corresponding blocks of functional logic (while the other blocks of functional logic remain inactive.) At the end of the first subphase, comparator 735 asserts its output, resetting the wave counter and causing the SHIFT_CLOCK signal to be asserted. The assertion of SHIFT_CLOCK causes the bits to be shifted in registers 630-633, so that they hold the bits "0101". As a result, during the second subphase, signals TARG1 and TARG3 are asserted, and data is propagated through the corresponding blocks of functional logic (with the blocks corresponding to TARG0 and TARG2 inactive.) Because only two of the blocks of functional logic are active during each functional subphase, only about half of the power is required (assuming that the active blocks are comparable to the inactive blocks.)

As shown in FIG. 8, the scan shift wave register holds a value that begins with "1000", so the hold signal is asserted for one cycle and then deasserted for three cycles, and this pattern is repeated every four cycles. Consequently, the hold signal is asserted every fourth cycle, causing data to be scanned into/out of the scan chains at a rate which is one-fourth of the base clock rate.

Figure 9:
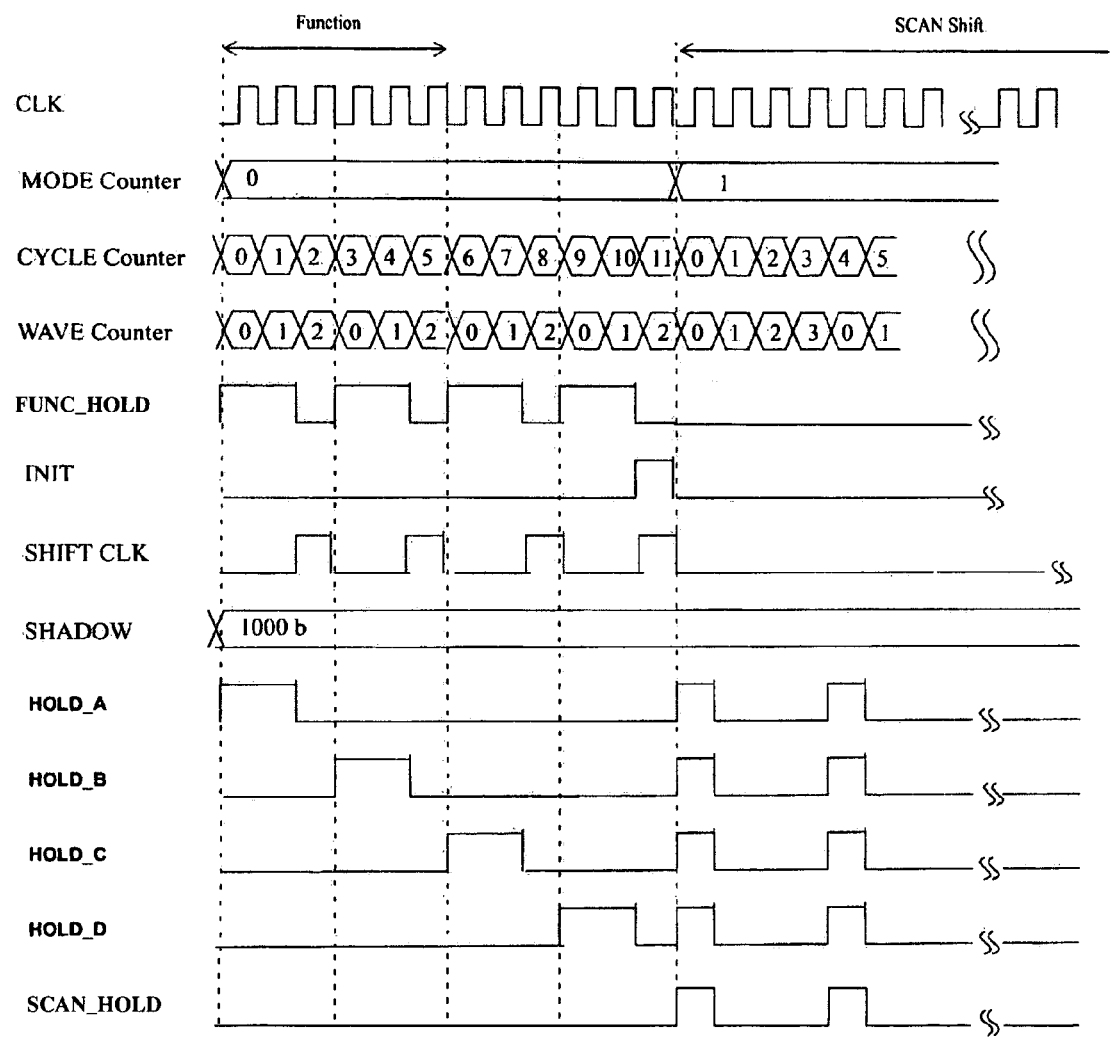
FIG. 9 is a timing diagram illustrating register values and signals associated with an alternative embodiment.

Referring to FIG. 9, a timing diagram illustrating an alternative scenario is shown. This scenario is based on the use of the same structure described above in connection with FIGS. 6 and 7. In this scenario, however, a different set of values is stored in the registers. In particular, functional mode cycle register 721 stores the value 11 instead of 5, and initialization registers 610-613 store the bits "1000".

The system operates in essentially the same manner in this scenario as in the previous scenario, except that there are four functional subphases (since wave counter 734 counts from 0-2 four times while cycle counter 724 counts from 0-11.) Also, because there is only a single 1 in shift registers 630-633, only one of the four target signals (TARG0-TARG3) is active during any functional subphase. Consequently, during the functional phase, the system needs only about one-fourth of the power that would be required if data were propagated through all of the functional logic at the same time, as in conventional LBIST systems.

Still other variations on the above systems and methods are also possible. For example, in one alternative embodiment the structure of the clock control block and the hold control block are the same as in the previous system, but the structure of the PRPG, the MISR and possibly the scan chains is slightly different. In the system of FIG. 6, each block of the functional logic had a corresponding PRPG and MISR. Each of the blocks could therefore be activated without regard to the others. In the alternative system however, a single PRPG and a single MISR are used.

It should be noted that, in this alternative embodiment data is propagated through the functional logic from right to left (as opposed to being propagated from left to right, as in FIG. 6.) This is because, in this embodiment, it is assumed that a common scan chain is used between successive blocks of functional logic. In this case, after scanning data into the scan chains, it is preferable to propagate the data through the last block of functional logic first in order to make the scan chain preceding this block of functional logic available to capture the output of the preceding block of functional logic. It should also be noted that the initialization registers should store the bits "1000" in order to maintain this order. This assumes that it is desired to use the bit patterns generated by the PRPG (in order for the propagated bits to have known characteristics.) It is alternatively possible to simply use whatever bits propagate through one block of functional logic as inputs to the succeeding block of functional logic. If the operation of the device under test is being compared to the identical testing of a "good" device, the device under test should duplicate the results of the "good" device, even if the propagated bit patterns are not known.

While the foregoing description presents several specific exemplary embodiments, there may be many variations of the described features and components in alternative embodiments. Many of these variations will be apparent to persons of skill in the art of the invention upon reading the present disclosure.

Those of skill in the art will understand that information and signals may be represented using any of a variety of different technologies and techniques. For example, data, instructions, commands, information, signals, bits and symbols that may be referenced throughout the above description may be represented by voltages, currents, electromagnetic waves, magnetic fields and the like. The information and signals may be communicated between components of the disclosed systems using any suitable transport media, including wires, metallic traces, vias, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with application specific integrated circuits (ASICs), field programmable gate arrays (FPGAs), general purpose processors, digital signal processors (DSPs) or other logic devices, discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in software (program instructions) executed by a processor, or in a combination of the two. Software may reside in RAM memory, flash memory, ROM memory, EPROM memory, EEPROM memory, registers, hard disk, a removable disk, a CD-ROM, or any other form of storage medium known in the art. Such a storage medium containing program instructions that embody one of the present methods is itself an alternative embodiment of the invention. One exemplary storage medium may be coupled to a processor, such that the processor can read information from, and write information to, the storage medium. In the alternative, the storage medium may be integral to the processor. The processor and the storage medium may reside, for example, in an ASIC. The ASIC may reside in a user terminal. The processor and the storage medium may alternatively reside as discrete components in a user terminal or other device.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

What is claimed is:

1. A method comprising:
    performing one or more test cycles of an LBIST system, including in each test cycle
        consecutively performing a plurality of functional subphases, wherein in each functional subphase data is propagated from one or more of a plurality of scan chains through a different portion of functional logic in a device under test, and
        performing a scan-shift phase in which data is scanned into and out of the scan chains.

2. The method of claim 1, wherein the functional subphases in each test cycle are performed at a normal operating speed of the device under test.

3. The method of claim 2, wherein the scan shift phase is performed at a speed that is less than the normal operating speed of the device under test.

4. The method of claim 1, further comprising providing pseudorandom bit patterns to each of the different portions of functional logic from a separate pseudorandom bit pattern generator, and providing data which is propagated through each of the different portions of functional logic to a separate multiple input signature register.

5. The method of claim 1, further comprising providing pseudorandom bit patterns to each of the different portions of functional logic from a common pseudorandom bit pattern generator and providing data propagated which is through each of the different portions of functional logic to a common multiple input signature register.

6. The method of claim 1, wherein performing the functional subphases comprises, in each functional subphase, enabling functional operations in one or more of the portions of functional logic and inhibiting functional operations in one or more others of the portions of functional logic.

7. The method of claim 6, wherein enabling functional operations in one or more of the portions of functional logic and inhibiting functional operations in one or more others of the portions of functional logic comprises selectively gating a clock signal to the portions of functional logic.

8. A system comprising:
    functional logic in a device under test;
    a plurality of scan chains interposed with the functional logic; and
    an LBIST controller coupled to the functional logic and scan chains;
    wherein the LBIST controller is configured to propagate data from the scan chains through each of two or more different portions of the functional logic in a corresponding functional subphase of a test cycle; and
    wherein the LBIST controller is configured to execute the functional subphases consecutively in a functional phase and to execute the functional phase alternately with a scan shift phase.

9. The system of claim 8, wherein the LBIST controller is configured to cause functional operations to be performed during the functional subphases at a normal operating speed of the device under test.

10. The system of claim 9, wherein the LBIST controller is configured to cause scan shift operations to be performed during the scan shift phase at a speed that is less than the normal operating speed of the device under test.

11. The system of claim 8, further comprising a plurality of pseudorandom bit pattern generators and a plurality of multiple input signature registers, wherein each of the pseudorandom bit pattern generators and each of the multiple input signature registers is associated with a corresponding one of the different portions of the functional logic.

12. The system of claim 8, further comprising a single pseudorandom bit pattern generator configured to provide pseudorandom bit patterns to each of the different portions of functional logic and a single multiple input signature register configured to receive data which is propagated through each of the different portions of functional logic.

13. The system of claim 8, wherein the LBIST controller is configured to provide a plurality of control signals to the different portions of the functional logic, wherein each control signal corresponds to one of the different portions of the functional logic, and wherein each control signal alternately enables or inhibits functional operations in the corresponding portion of the functional logic.

14. The system of claim 13, further comprising a plurality of shift latches, wherein each shift latch corresponds to one of the control signals, wherein the LBIST controller is configured to enable or inhibit each control signal based upon the contents of the corresponding shift latch, and wherein the LBIST controller is configured to shift the contents of the shift latches serially through succeeding ones of the shift latches.

15. The system of claim 14, wherein the shift latches are each configured to store one bit, wherein the bit stored in each shift latch is AND'ed with a clock signal and the result is provided as a clock signal to the corresponding portion of the functional logic.

16. A device comprising:
    an LBIST controller;
    wherein the LBIST controller is configured to selectively enable functional operations in different portions of a device under test at different times
    wherein the LBIST controller is configured to generate a plurality of control signals,
    wherein each control signal corresponds to one of the different portions of the device under test, and
    wherein the LBIST controller selectively inhibits clock signals that are provided to the different portions of the device under test using the corresponding control signals.

* * * * *